United States Patent
Embar et al.

(10) Patent No.: US 9,641,140 B2
(45) Date of Patent: May 2, 2017

(54) METHOD AND APPARATUS FOR A MULTI-HARMONIC MATCHING NETWORK

(71) Applicants: Ramanujam Srinidhi Embar, Gilbert, AZ (US); Weng Chuen Edmund Neo, Chandler, AZ (US); Yu-Ting D. Wu, Gilbert, AZ (US)

(72) Inventors: Ramanujam Srinidhi Embar, Gilbert, AZ (US); Weng Chuen Edmund Neo, Chandler, AZ (US); Yu-Ting D. Wu, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/317,864

(22) Filed: Jun. 27, 2014

(65) Prior Publication Data
US 2015/0381140 A1 Dec. 31, 2015

(51) Int. Cl.
*H03H 7/38* (2006.01)
*H03F 3/19* (2006.01)
(Continued)

(52) U.S. Cl.
CPC ............... *H03F 3/217* (2013.01); *H01P 1/20* (2013.01); *H03F 1/56* (2013.01); *H03F 3/195* (2013.01);
(Continued)

(58) Field of Classification Search
CPC .. H03H 7/38; H03H 7/383; H03F 3/19; H03F 3/217; H03F 3/195; H03F 3/245; H03F 3/60; H03F 1/56; H01P 1/20
(Continued)

(56) References Cited

U.S. PATENT DOCUMENTS

| | | | |
|---|---|---|---|
| 6,388,540 B1 * | 5/2002 | Uda | H01P 1/2007 330/53 |
| 6,577,199 B2 | 6/2003 | Dent | |
| 7,418,251 B2 | 8/2008 | Liu | |

OTHER PUBLICATIONS

Helaoui, M. et al., "Optimizing Losses in Distributed Multiharmonic Matching Networks Applied to the Design of an RF GaN Power Amplifier With Higher Than 80% Power-Added Efficiency," IEEE Transactions on Microwave Theory and Techniques, vol. 57, No. 2; Feb. 2009; pp. 314-322.

(Continued)

*Primary Examiner* — Stephen E Jones
*Assistant Examiner* — Scott S Outten

(57) ABSTRACT

A matching network and method for matching a source impedance to a load impedance is provided. A bias feed microstrip structure is coupled to a direct current (DC) voltage source and has a bias feed microstrip electrical length less than one fifth of a fundamental wavelength of a fundamental frequency component of an input signal. A harmonic impedance transformation network can be configured to compensate for parasitic reactances of a precursor element. A tuned impedance element presents a short circuit impedance at the second harmonic impedance transformation network terminal for harmonic frequency components and presents a higher impedance for the fundamental frequency component. A fundamental impedance transformation network is configured to match a fundamental impedance transformation network input impedance for the fundamental frequency component to a load impedance of a load. Multiple instances of the harmonic impedance transformation network and the tuned impedance element can be provided.

20 Claims, 3 Drawing Sheets

(51) Int. Cl.
*H03F 3/217* (2006.01)
*H03F 1/56* (2006.01)
*H03F 3/195* (2006.01)
*H03F 3/24* (2006.01)
*H03F 3/60* (2006.01)
*H01P 1/20* (2006.01)

(52) U.S. Cl.
CPC ............... *H03F 3/245* (2013.01); *H03F 3/60* (2013.01); *H03H 7/383* (2013.01); *H03F 2200/222* (2013.01); *H03F 2200/387* (2013.01)

(58) Field of Classification Search
USPC .......................................................... 333/33
See application file for complete search history.

(56) References Cited

OTHER PUBLICATIONS

Kim, Jangheon et al., "A Saturated PA with High Efficiency," IEEE Microwave Magazine, Feb. 2009, pp. 126-133.
Grebennikov, A. et al. "Load Network Design Technique for Class F and Inverse Class F PAs", High Frequency Electronics, vol. 10, No. 5, pp. 58-76 (May 2011).

* cited by examiner

METHOD AND APPARATUS FOR A MULTI-HARMONIC MATCHING NETWORK

BACKGROUND

Field of the Disclosure

The present disclosure relates generally to electronic components and more particularly to impedance matching networks.

Background of the Disclosure

Radio frequency (RF) systems are used to provide wireless communication, for example, for cellular telephony, wireless data networks, and radio systems. RF systems transfer power most efficiently when the impedances of their components are properly matched. Matching networks can be used to present an appropriate impedance to the input or output of a component. Harmonic matching networks can present appropriate impedances not only at a fundamental frequency of a signal, but also at one or more harmonic frequencies of that signal. For some types of RF power amplifiers (PAs), for example, switch mode power amplifiers, it can be desirable to present very different impedances for some harmonics, such as even harmonics, than for other harmonics, such as odd harmonics. However, some approaches to providing multi-harmonic matching networks have suffered from disadvantages, such as poor RF bandwidth (BW), poor video bandwidth (VBW), large size, poor efficiency, and poor power handling capability.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A matching network and method for matching a source impedance to a load impedance is provided. A bias feed microstrip structure is coupled to a direct current (DC) voltage source and has a bias feed microstrip electrical length substantially less than one fourth of a fundamental wavelength of a fundamental frequency component of an input signal. For example, the bias feed microstrip can have an electrical length less than one fifth or, as another example, less than one sixth of the fundamental wavelength. A harmonic impedance transformation network can be configured to terminate a given harmonic frequency component with an optimum impedance. As used herein, the term "optimum impedance" refers to an impedance optimized for the application for which the matching network is used. The optimum impedance can be selected to compensate for parasitic reactances of a precursor element coupled to the input terminal. A tuned impedance element, such as a microstrip stub or a capacitor resonating at the given harmonic frequency component presents a short circuit impedance at the second harmonic impedance transformation network terminal for harmonic frequency components of the input signal and presents a higher impedance for the fundamental frequency component. A fundamental impedance transformation network is configured to match a fundamental impedance transformation network input impedance for the fundamental frequency component to a load impedance of a load. Multiple instances of the harmonic impedance transformation network and the tuned impedance element can be provided for different harmonic frequency components.

Figure 1:
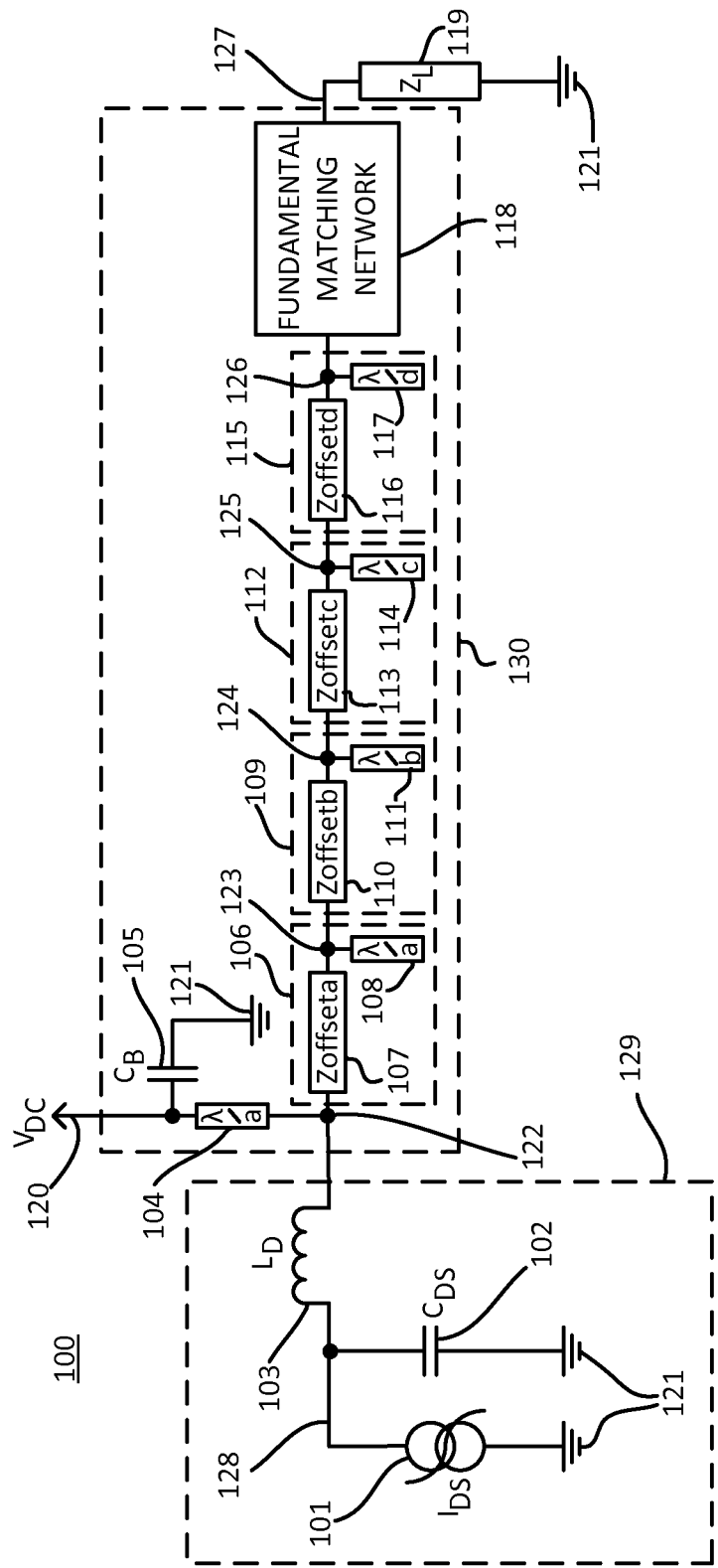
FIG. 1 is a schematic diagram illustrating a circuit comprising a non-ideal source, a matching network, and a load according to one embodiment.

FIG. 1 is a schematic diagram illustrating a circuit 100 comprising a non-ideal source 129, a matching network 130, and a load 119 according to one embodiment. Non-ideal source 129 is shown as having its output connected to an input of matching network 130. Matching network 130 is shown as having its output connected to an input of load 119. Non-ideal source 129 comprises current source 101, parasitic capacitance 102, and parasitic inductance 103. A first terminal of current source 101, at node 128, is connected to a first terminal of parasitic capacitance 102, which is in parallel with current source 101, and to a first terminal of parasitic inductance 103, which is in series with current source 101. These parasitic reactances are not necessarily desired to be present in conjunction with current source 101 and can be intrinsic characteristics that prevent current source 101 from operating as an ideal current source. A second terminal of current source 101 is connected to ground potential 121. A second terminal of parasitic capacitance 102 is connected to ground potential 121. An output of non-ideal source 129 is provided at a second terminal of parasitic inductance 103 at node 122.

Matching network 130 comprises reduced length bias feed 104, bias feed capacitor 105, one or more of harmonic filtering networks 106, 109, 112, and 115, and fundamental impedance transformation network 118. Harmonic filtering network 106 comprises harmonic impedance transformation network 107, labeled Zoffseta, and stub 108. Harmonic filtering network 109 comprises harmonic impedance transformation network 110, labeled Zoffsetb, and stub 111. Harmonic filtering network 112 comprises harmonic impedance transformation network 113, labeled Zoffsetc, and stub 114. Harmonic filtering network 115 comprises harmonic impedance transformation network 116, labeled Zoffsetd, and stub 117.

A direct current (DC) voltage source 120 is connected to a first terminal of bias feed capacitor 105 and to a first terminal of reduced length bias feed microstrip structure 104. A second terminal of bias feed capacitor 105 is connected to ground potential 121. A second terminal of reduced length bias feed microstrip structure 104 is connected to a first terminal of harmonic impedance transformation network 107 at node 122. A second terminal of harmonic impedance transformation network 107 is connected to a first terminal of stub 108 and to a first terminal of harmonic impedance transformation network 110 at node 123. A second terminal of harmonic impedance transformation network 110 is connected to a first terminal of stub 111 and to a first terminal of harmonic impedance transformation network 113 at node 124. A second terminal of harmonic impedance transformation network 113 is connected to a first terminal of stub 114 and to a first terminal of harmonic impedance transformation network 116 at node 125. A second terminal of harmonic impedance transformation network 116 is connected to a first terminal of stub 117 and to a first terminal of fundamental impedance transformation network 118 at node 126. A second terminal of fundamental impedance transformation network 118 is connected to a first terminal of load 119 at node 127. A second terminal of load 119 is connected to ground potential 121.

Because of parasitic components of non-ideal source 129, such as parasitic capacitance 102 and parasitic inductance 103, the output impedance of current source 101 is transformed to an impedance value other than what would be ideal. The characteristics of one or more of harmonic filtering networks 106, 109, 112, and 115 can be selected to compensate for the non-ideal output impedance of non-ideal source 129, thereby providing an impedance match for non-ideal source 129, which can maximize power transfer and efficiency of circuit 100.

Each of harmonic filter networks 106, 109, 112, and 115 can be implemented using components having values selected for a different harmonic frequency component. For example, reduced length bias feed 104 and harmonic filtering network 106 can be implemented using components having values selected for a fifth harmonic frequency component (5f0), harmonic filtering network 109 can be implemented using components having values selected for a fourth harmonic frequency component (4f0), harmonic filtering network 112 can be implemented using components having values selected for a third harmonic frequency component (3f0), and harmonic filtering network 115 can be implemented using components having values selected for a second harmonic frequency component (2f0), wherein, as denoted by the coefficients preceding f0, the harmonic frequency components are at frequencies which are their respective multiples of a fundamental frequency component, f0. For such an example, for $\lambda$ representing a wavelength of the fundamental frequency component, the length of a transmission line implementing reduced length bias feed 104, shown as $\lambda/a$, would be $\lambda/20$, which would be a quarter-wave transformer for the fifth harmonic frequency component (5f0), and the length of a transmission line implementing stub 108, also shown as $\lambda/a$, would be $\lambda/20$, which would be a quarter-wave open-circuit stub for the fifth harmonic frequency component (5f0). The length of a transmission line implementing stub 111, shown as $\lambda/b$, would be $\lambda/16$, which would be a quarter-wave open-circuit stub for the fourth harmonic frequency component (4f0). The length of a transmission line implementing stub 114, shown as $\lambda/c$, would be $\lambda/12$, which would be a quarter-wave open-circuit stub for the third harmonic frequency component (3f0). The length of a transmission line implementing stub 117, shown as $\lambda/d$, would be $\lambda/8$, which would be a quarter-wave open-circuit stub for the second harmonic frequency component (2f0). The values of harmonic impedance transformation networks 107, 110, 113, and 116 can be chosen to transform the impedances presented at stubs 108, 111, 114, and 117 to values desired for matching the input impedances of the respective harmonic filtering networks in which harmonic impedance transformation networks 107, 110, 113, and 116 are present. The value of fundamental impedance transformation network 118 can be chosen to match the load impedance of load 119 at node 127 to the impedance present at node 126. Thus, fundamental impedance transformation network 118 can be considered to be a fundamental matching network, that is, a matching network for the fundamental frequency component of the signal provided at node 122.

As the harmonic filtering networks are effective for their respective harmonic frequency components and other harmonic frequency components that are odd multiples of the respective harmonic frequency components, the respective harmonic frequency for each of harmonic filtering networks 106, 109, 112, and 115 can be selected from harmonic frequency components denoted by the union of the set of all prime numbers and the set of all powers of two, for as many harmonic filtering networks as are desired to be implemented. For example, as a harmonic filtering network for a second harmonic frequency component would also be effective for filtering a sixth harmonic frequency component and a tenth harmonic frequency component, and a harmonic filtering network for a third harmonic frequency component would also be effective for filtering a ninth harmonic frequency component, implementation of harmonic filtering networks for the second, third, fourth, fifth, seventh, and eighth harmonic frequency components would provide filtering for all harmonic frequency components from the second harmonic frequency component to the tenth harmonic frequency component, inclusive.

While matching network 130 is shown in FIG. 1 to receive its input at the output of non-ideal source 129 at node 122, it should be understood that matching network 130 could be implemented to provide its output to a control terminal of current source 101 upon which the current provided by current source 101 depends. Thus, matching network 130 could be used as an input matching filter as well as, or as an alternative to, being used as an output matching filter. Moreover, matching network 130 could be used in other applications where a multi-harmonic matching network is desired. Reduced length bias feed 104 can be moved or omitted for other types of matching filter applications.

While elements of matching network 130 are illustrated as transmission lines with specified characteristics, it should be understood that one or more of the elements can be implemented as lumped components, such as capacitors and inductors, selected to provide similar impedance characteristics.

Figure 2:
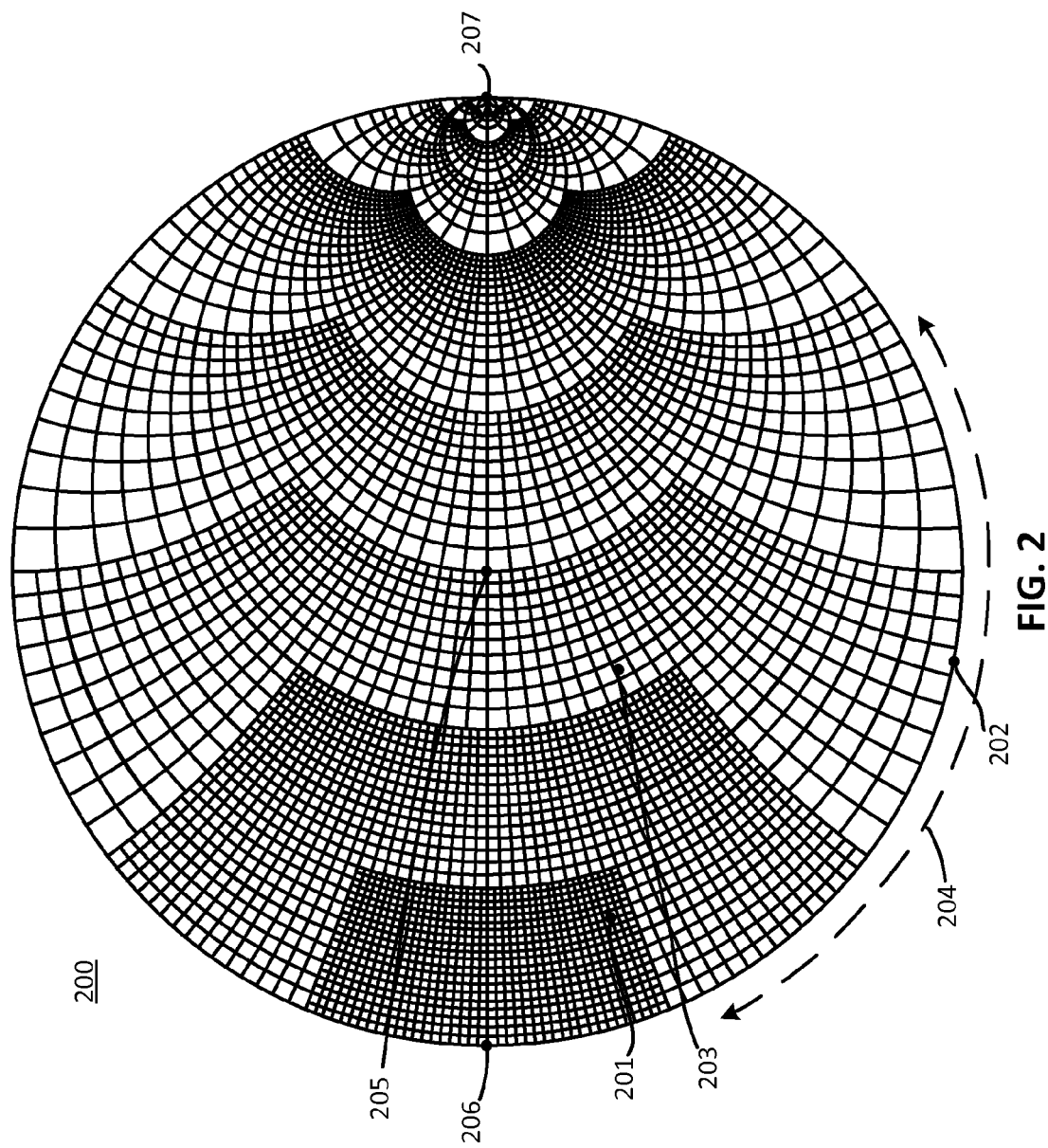
FIG. 2 is a Smith chart diagram illustrating impedances presented by a matching network for a fundamental frequency component and harmonic frequency components according to one embodiment.

FIG. 2 is a Smith chart diagram 200 illustrating impedances presented by a matching network for a fundamental frequency component and harmonic frequency components according to one embodiment. Such impedances are presented as an example of a particular illustrative embodiment and should not be construed as limitations on impedances with which other embodiments can be practiced. Several points representative of impedance values are depicted on Smith chart diagram 200. Point 205, at the center of Smith chart diagram 200, represents a 50-ohm purely resistive impedance value. Point 206, at the left extreme of Smith chart diagram 200, represents a purely resistive short circuit impedance value. Point 207, at the right extreme of Smith chart diagram 200, represents a purely resistive open circuit impedance value. The upper semicircle of Smith chart diagram 200 represents inductively reactive impedance values. The lower semicircle of Smith chart diagram 200 represents capacitively reactive impedance values.

For a device for which a matching network is to be provided, in a type of circuit in which the device is to be employed, design analysis, for example, simulations, can be performed to determine optimal impedances to be presented to the device. Such optimal impedances can be determined for desired design parameter values, such as for a high efficiency value and a high power output value. As an example, a particular gallium nitride (GaN) pseudomorphic high electron mobility transistor (pHEMT) in an inverse Class F (Class $F^{-1}$) amplifier circuit can have an optimal output impedance at a fundamental frequency component of its output signal of 7-8j ohms and an optimal output impedance at a second harmonic frequency component of its output signal of −45j ohms in accordance with one illustrative embodiment.

As shown in FIG. 2, point 201 at 7-8j ohms represents an impedance presented by a matching network for a fundamental frequency component (f0) according to one embodiment. The impedance at point 201 is equal, in both its real and imaginary terms, to the optimal output impedance for the fundamental frequency component in the example described above. Point 202 at 0-41.2j ohms represents an impedance presented by the matching network for a second harmonic frequency component (2f0) according to one embodiment. The impedance at point 202 is equal in its real term and very close in its imaginary term to the optimal output impedance for the second harmonic frequency component in the example described above. Point 203 at 28.7-17.6j ohms represents an impedance presented by the matching network for a third harmonic frequency component (3f0) according to one embodiment.

Such impedance values can be realized, for example, using an embodiment implemented according to the schematic diagram of FIG. 1 wherein harmonic filtering network 106 is provided, with stub 108 tuned to present a short circuit impedance to the second harmonic frequency component (2f0) at node 123, and wherein harmonic filtering networks 109, 112, and 115 are omitted, with node 123 connected to node 126. Note that the term "tuned," as used herein, refers to having a frequency selective impedance characteristic that is substantially different for one or more harmonic frequency components than for one or more other harmonic frequency components and than for the fundamental frequency component. Such a frequency selective impedance characteristic may be designed into a circuit to be produced, and each circuit produced need not necessarily (but optionally can) be individually adjusted to exhibit the desired frequency selective impedance characteristic. By presenting a short circuit impedance to the second harmonic frequency component (2f0), stub 108 would, by itself, place point 202 at point 206 on Smith chart diagram 200. However, harmonic impedance transformation network 107, labeled Zoffseta, of FIG. 1 rotates the impedance presented for the second harmonic frequency component around the circumference of Smith chart diagram 200 as a function of the apparent electrical length of harmonic impedance transformation network 107 relative to the wavelength of the second harmonic frequency component. As frequency is inversely related to wavelength, for a given apparent electrical length of harmonic impedance transformation network 107, harmonic impedance transformation network 107 can place point 202 within range 204 over a fundamental frequency component range of, for example, 2.140 GHz to 6.420 GHz. By adjusting the characteristics of harmonic impedance transformation network 107, the location of point 202 along the circumference of Smith chart diagram 200 within range 204 can be controlled over a broad range of frequencies, for example, 2.140 GHz to 6.420 GHz. By presenting a short circuit impedance at point 123, stub 108 effectively removes the second harmonic frequency component (2f0) from the signal being provided to fundamental impedance transformation network 118.

Figure 3:
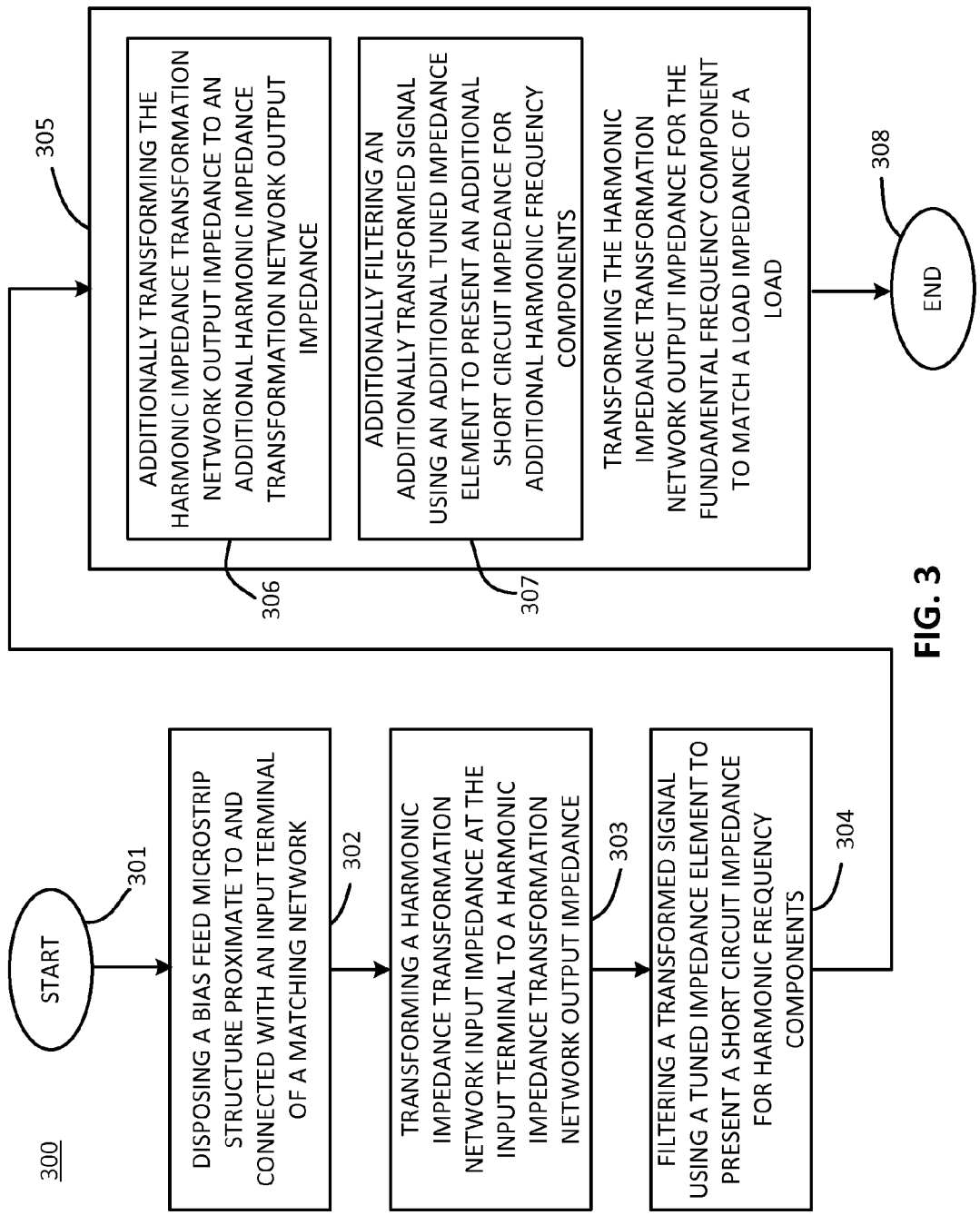
FIG. 3 is a flow diagram illustrating a method for matching a source impedance to a load impedance in a matching network according to one embodiment.

FIG. 3 is a flow diagram illustrating a method 300 for matching a source impedance to a load impedance in a matching network according to one embodiment. Method 300 begins at block 301. From block 301, method 300 continues to block 302. At block 302, a bias feed microstrip structure is disposed proximate to and connected with an input terminal of the matching network, the bias feed microstrip coupled to a direct current (DC) voltage source. The bias feed microstrip structure has a bias feed microstrip electrical length substantially less than one quarter of a fundamental wavelength of a fundamental frequency component of an input signal at the input terminal, for example, less than one fifth of the fundamental wavelength or, as another example, less than one sixth of the fundamental wavelength. From block 302, method 300 continues to block 303. At block 303, a harmonic impedance transformation network input impedance at the input terminal is transformed to a harmonic impedance transformation network output impedance. The transforming is configured to compensate for parasitic reactances of a precursor element coupled to the input terminal. From block 303, method 300 continues to block 304. At block 304, a transformed signal is filtered using a tuned impedance element, such as a microstrip stub or a capacitor resonating at a selected harmonic frequency component, to present a short circuit impedance for harmonic frequency components but not for the fundamental frequency component. The harmonic frequency components are harmonics of the fundamental frequency component. From block 304, method 300 continues to block 305. At block 305, the harmonic impedance transformation network output impedance for the fundamental frequency component is transformed to match a load impedance of a load.

While at least one embodiment can be practiced with a single instance of transforming a harmonic impedance transformation network input impedance to a harmonic impedance transformation network output impedance, as shown in block 303 and filtering, as shown in block 304, other embodiments can be practiced with multiple instances of harmonic impedance transformation and filtering, which can be applied, for example, to different harmonic frequency components. In accordance with at least one embodiment, the transforming the harmonic impedance transformation network output impedance to match the load impedance of the load of block 305 also includes additionally transforming the harmonic impedance transformation network output impedance to an additional harmonic impedance transformation network output impedance at block 306. The additionally transforming compensates for parasitic reactances of a precursor element coupled to the input terminal. In accordance with at least one embodiment, the transforming of block 305 also includes additionally filtering an additionally transformed signal using an additional tuned impedance element to present an additional short circuit impedance for additional harmonic frequency components but not for the fundamental frequency component at block 307. The additional harmonic frequency components are additional harmonics of the fundamental frequency component. Further instances of blocks 306 and 307 can be implemented, for example, with respect to further additional harmonic frequency components, with block 305 culminating with transforming the output impedance of the final instance for the fundamental frequency component to match the load impedance of the load, as described in the main portion of block 305. From block 305, method 300 continues to block 308, where it ends. In accordance with at least one embodiment, method 300 also includes disposing the matching network within an integrated circuit package of an integrated circuit.

In accordance with at least one embodiment, a distributed or lumped component input or output matching network topology is provided which offers controlled reactive harmonic terminations at high frequencies and broader VBW which can be applied to a switch-mode type of PAs. The matching network can be used to achieve high efficiency and high peak power in any switch-mode type PAs. Also, compact size, PA linearity, RF BW, and VBW can be achieved.

At least one embodiment can be used to provide a multi-harmonic match for gallium nitride (GaN), laterally diffused metal oxide semiconductor (LDMOS), gallium arsenide (GaAs) based, or other types of power amplifiers (PAs). At least one embodiment can be used to provide a multi-harmonic match for high power transistors (e.g., more than 10 watts), although embodiments could be used with lower power transistors, as well. At least one embodiment can be used to provide harmonic control for a base-station PA comprising such high power transistors, although embodiments could be used in other types of systems, as well. By providing an optimum harmonic termination for a nonlinear current source, RF performance can be improved significantly.

Use of physically small components, such as a reduced length bias feed and one or more stubs sized for one or more harmonic frequency components rather than for a fundamental frequency component, can provide a physically compact matching network, which is aligned with current PA trends to reduce the size of base-stations. Furthermore, by placing a reduced length bias feed proximate to the PA for which it is provided, RF BW and VBW of the PA is not unduly limited and can be optimized.

By taking into consideration package parasitic characteristics, proper harmonic matching can be provided for actual PAs rather than just for idealized concepts of PAs in which the effects of parasitics are overlooked.

Examples of the switch-mode PAs with which embodiments can be practiced include class-F and inverse class-F (class $F^{-1}$) PAs. Broad BWs can be provided while delivering the desired harmonic terminations at the transistor reference plane.

In accordance with at least one embodiment, a distributed matching network provides optimum second harmonic (2f0) termination. By controlling a length of a harmonic impedance transformation network, which can be implemented, for example, using offset microstrip $Z_{offset}$, the second harmonic load can be set to a desired value corresponding to a desired location on the Smith chart unit circle. Without necessarily altering an impedance value $Z_1$ of a fundamental impedance transformation network, the width of the offset microstrip $Z_{offset}$ can be adjusted to achieve fundamental match.

Bias feed with reduced length (e.g., λ/8 with respect to the wavelength of the fundamental frequency component) can be implemented close to the transistor package to improve VBW and linearity.

In an example of a distributed matching network with optimum second and third harmonic termination, bias feed length can be reduced to λ/12 with respect to the wavelength of the fundamental frequency component. The matching network can present an optimal impedance to a source to which it is coupled for both the fundamental frequency component and for the second harmonic frequency component (e.g., the matching network can present an optimal ZL(f0) & ZL(2f0)).

At least one embodiment can simultaneously achieve wider RF BW and VBW by incorporating controlled reactive harmonic terminations at high frequencies to realize highly efficient switch-mode type of PAs. At least one embodiment provides a multi-harmonic matching network with multi-harmonic terminations suitable for use with, for example, saturated PAs, such as switch-mode PAs, which can, for example, be class-F PAs or inverse class-F PAs. To enhance bandwidth, a radial or butterfly stub can be used for wider band termination or when a suitable capacitor is not found. At least one embodiment can reduce the impedance by greater than 30 percent at 100 MHz away from a nominal (e.g., base band) frequency and by greater than 50 percent at 200 MHz away from the nominal frequency.

At least one embodiment offers flexibility to provide optimum harmonic termination (thereby achieving high efficiency) by taking into account transistor package parasitic. At least one embodiment provides both high efficiency and large video bandwidth (enabling large signal bandwidth). At least one embodiment implements distributed matching networks to realize a multi-harmonic terminated high efficiency PAs using a high power transistor (e.g., a transistor providing more than 10 watts). Furthermore, the video bandwidth may be enhanced by using a reduced length bias feed close to the device plane. At least one embodiment can provide high efficiency and high VBW for a GaN device, such as a GaN PA.

In accordance with at least one embodiment, a matching network comprises an input terminal for receiving an input signal, a bias feed microstrip structure, a harmonic impedance transformation network, a tuned impedance element, and a fundamental impedance transformation network. The bias feed microstrip structure has a first bias feed end connected to the input terminal and a second bias feed end coupled to a direct current (DC) voltage source. The bias feed microstrip structure has a bias feed microstrip electrical length substantially less than one fourth of a fundamental wavelength of a fundamental frequency component of the input signal, for example, less than one fifth of the fundamental wavelength, or, as another example, less than one sixth of the fundamental wavelength. The harmonic impedance transformation network has a first harmonic impedance transformation network terminal coupled to the input terminal. The harmonic impedance transformation network is configured to present, with respect to the input terminal, an optimum impedance for a harmonic frequency component of the input signal.

The tuned impedance element is coupled to a second harmonic impedance transformation network terminal of the harmonic impedance transformation network. The tuned impedance element presents a short circuit impedance at the second harmonic impedance transformation network terminal for the harmonic frequency component and presents a higher impedance for the fundamental frequency component. The harmonic frequency component is a harmonic of the fundamental frequency component. The fundamental impedance transformation network has a first fundamental impedance transformation network terminal coupled to the second harmonic impedance transformation network terminal and a second fundamental impedance transformation network terminal coupled to a first load terminal of a load. The fundamental impedance transformation network is configured to match a fundamental impedance transformation network input impedance for the fundamental frequency component to a load impedance of the load.

In accordance with at least one embodiment, the matching network is an input matching network of a radio frequency (RF) power amplifier (PA). In accordance with at least one embodiment, the matching network is an output matching network of a RF PA. In accordance with at least one embodiment, the matching network further comprises a capacitor having a first capacitor terminal coupled to the second bias feed end and a second capacitor terminal coupled to a ground potential. In accordance with at least one embodiment, the matching network is coupled to a switch mode power amplifier. In accordance with at least one embodiment, the switch mode power amplifier is a Class F power amplifier. In accordance with at least one embodiment, the switch mode power amplifier is an inverse Class F power amplifier. In accordance with at least one embodiment, the tuned impedance element is an open circuit stub having a tuned impedance element electrical length less than one fifth of the fundamental wavelength. In accordance with at least one embodiment, the tuned impedance element is an open circuit stub having a tuned impedance element electrical length less than one sixth of the fundamental wavelength.

In accordance with at least one embodiment, the matching network is disposed within an integrated circuit package of an integrated circuit. In accordance with at least one embodiment, the bias feed microstrip structure is disposed proximate to a semiconductor device reference plane. In accordance with at least one embodiment, the harmonic frequency component is at least one even harmonic of the fundamental frequency component. In accordance with at least one embodiment, the matching network further comprises an additional harmonic impedance transformation network and an additional tuned impedance element. The additional harmonic impedance transformation network is interposed between the harmonic impedance transformation network and the load. The additional harmonic impedance transformation network comprises a first additional harmonic impedance transformation network terminal coupled to the second harmonic impedance transformation network terminal and a second additional harmonic impedance transformation network terminal coupled to the first fundamental impedance transformation network terminal. The additional tuned impedance element is coupled to the second additional harmonic impedance transformation network terminal. The additional tuned impedance element presents a short circuit at the second additional harmonic impedance transformation network terminal for an additional harmonic frequency component and presents an additional higher impedance for the fundamental frequency component. The additional harmonic frequency component is an additional harmonic of the fundamental frequency component.

In accordance with at least one embodiment, the harmonic frequency component is an odd harmonic of the fundamental frequency component and the additional harmonic frequency component is an even harmonic of the fundamental frequency component. In accordance with at least one embodiment, the harmonic frequency component is an odd harmonic of the fundamental frequency component.

In accordance with at least one embodiment, a method for matching a source impedance to a load impedance in a matching network comprises disposing a bias feed microstrip proximate to and connected with an input terminal of the matching network, transforming a harmonic impedance transformation network input impedance at the input terminal to a harmonic impedance transformation network output impedance, filtering a transformed signal using a tuned impedance element to present a short circuit impedance for the harmonic frequency component but not for the fundamental frequency component, and transforming the harmonic impedance transformation network output impedance for the fundamental frequency component to match a load impedance of a load. The bias feed microstrip is coupled to a direct current (DC) voltage source. In accordance with at least one embodiment, the bias feed microstrip structure has a bias feed microstrip electrical length less than one fifth of a fundamental wavelength of a fundamental frequency component of an input signal at the input terminal. In accordance with at least one embodiment, the bias feed microstrip structure has a bias feed microstrip electrical length less than one sixth of a fundamental wavelength of a fundamental frequency component of an input signal at the input terminal. The transforming is configured to present, with respect to the input terminal, an optimum impedance for a harmonic frequency component of the input signal. The harmonic frequency component is a harmonic of the fundamental frequency component.

In accordance with at least one embodiment, the transforming the harmonic impedance transformation network output impedance to match the load impedance of the load comprises additionally transforming the harmonic impedance transformation network output impedance to an additional harmonic impedance transformation network output impedance and additionally filtering an additional transformed signal. The additionally transforming presents an additional optimum impedance for an additional harmonic frequency component of the input signal. The additionally filtering the additionally transformed signal uses an additional tuned impedance element to present an additional short circuit impedance for the additional harmonic frequency component but not for the fundamental frequency component. The additional harmonic frequency component is an additional harmonic of the fundamental frequency component. In accordance with at least one embodiment, the method further comprises disposing the matching network within an integrated circuit package of an integrated circuit.

In accordance with at least one embodiment, a matching network comprises an input terminal for receiving an input signal, a bias feed microstrip structure, a plurality of harmonic filtering networks. The bias feed microstrip structure has a first bias feed end connected to the input terminal and a second bias feed end coupled to a direct current (DC) voltage source. The bias feed microstrip structure has a bias feed microstrip electrical length substantially less than one fourth of a fundamental wavelength of a fundamental frequency component of the input signal, for example, length less than one fifth of the fundamental wavelength or, as another example, less than one sixth of the fundamental wavelength. The plurality of harmonic filtering networks are configured in succession to one another. Each of the harmonic filtering networks comprises a respective harmonic impedance transformation network for transforming a respective harmonic impedance transformation network input impedance to a respective harmonic impedance transformation network output impedance. At least one harmonic impedance transformation network is configured to present an optimum impedance for at least one respective harmonic frequency component of the input signal. The respective tuned impedance element is coupled to a respective harmonic impedance transformation network output of the respective harmonic impedance transformation network. The respective tuned impedance element presents a short circuit impedance at the respective harmonic impedance transformation network output for the at least one respective harmonic frequency component and presents a higher impedance for the fundamental frequency component. The at least one respective harmonic frequency component is a respective harmonic of the fundamental frequency component. In accordance with at least one embodiment, the matching network further comprises a fundamental impedance transformation network having a first fundamental impedance transformation network terminal coupled to a final respective harmonic impedance transformation network output and to a load. The fundamental impedance transformation network is configured to match a fundamental impedance transformation network input impedance for the fundamental frequency component to a load impedance of the load. In accordance with at least one embodiment, the matching network is disposed within an integrated circuit package of an integrated circuit.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A matching network comprising:
    an input terminal for receiving an input signal;
    a bias feed microstrip structure having a first bias feed end connected to the input terminal and a second bias feed end coupled to a direct current (DC) voltage source, the bias feed microstrip structure having a bias feed microstrip electrical length less than one fifth of a fundamental wavelength of a fundamental frequency component of the input signal, wherein the bias feed microstrip structure provides a quarter-wave transformer for the harmonic frequency component of the input signal;
    a harmonic impedance transformation network having a first harmonic impedance transformation network terminal coupled to the input terminal, the harmonic impedance transformation network configured to present, with respect to the input terminal, an optimum impedance for a harmonic frequency component of the input signal;
    a tuned impedance element coupled to a second harmonic impedance transformation network terminal of the harmonic impedance transformation network, the tuned impedance element presenting a short circuit impedance at the second harmonic impedance transformation network terminal for the harmonic frequency component and presenting a higher impedance for the fundamental frequency component, wherein the harmonic frequency component is a harmonic of the fundamental frequency component; and
    a fundamental impedance transformation network having a first fundamental impedance transformation network terminal coupled to the second harmonic impedance transformation network terminal and a second fundamental impedance transformation network terminal coupled to a first load terminal of a load, the fundamental impedance transformation network configured to match a fundamental impedance transformation network input impedance for the fundamental frequency component to a load impedance of the load.

2. The matching network of claim 1 wherein the matching network is coupled to a switch mode power amplifier.

3. The matching network of claim 2 wherein the switch mode power amplifier is a Class F power amplifier.

4. The matching network of claim 2 wherein the switch mode power amplifier is an inverse Class F power amplifier.

5. The matching network of claim 1 further comprising:
    an additional harmonic impedance transformation network interposed between the harmonic impedance transformation network and the load, the additional harmonic impedance transformation network comprising a first additional harmonic impedance transformation network terminal coupled to the second harmonic impedance transformation network terminal and a second additional harmonic impedance transformation network terminal coupled to the first fundamental impedance transformation network terminal; and
    an additional tuned impedance element coupled to the second additional harmonic impedance transformation network terminal, the additional tuned impedance element presenting a short circuit at the second additional harmonic impedance transformation network terminal for an additional harmonic frequency component and presenting an additional higher impedance for the fundamental frequency component, wherein the additional harmonic frequency component is an additional harmonic of the fundamental frequency component.

6. The matching network of claim 5 wherein the harmonic frequency component is an odd harmonic of the fundamental frequency component and the additional harmonic frequency component is an even harmonic of the fundamental frequency component.

7. The matching network of claim 1 wherein the matching network is an input matching network of a radio frequency (RF) power amplifier (PA).

8. The matching network of claim 1 wherein the matching network is an output matching network of a RF PA.

9. The matching network of claim 1 wherein the tuned impedance element is an open circuit stub having a tuned impedance element electrical length less than one fifth of the fundamental wavelength.

10. The matching network of claim 1 wherein the matching network is disposed within an integrated circuit package of an integrated circuit.

11. The matching network of claim 1 wherein the bias feed microstrip structure is disposed proximate to a semiconductor device reference plane.

12. The matching network of claim 1 wherein the harmonic frequency component is at least one even harmonic of the fundamental frequency component.

13. The matching network of claim 1 further comprising:
    a capacitor having a first capacitor terminal coupled to the second bias feed end and a second capacitor terminal coupled to a ground potential.

14. The matching network of claim 1 wherein the harmonic frequency component is an odd harmonic of the fundamental frequency component.

15. A matching network comprising:
    an input terminal for receiving an input signal;
    a bias feed microstrip structure having a first bias feed end connected to the input terminal and a second bias feed end coupled to a direct current (DC) voltage source, the bias feed microstrip structure having a bias feed microstrip electrical length less than one fifth of a fundamental wavelength of a fundamental frequency component of the input signal, wherein the bias feed microstrip structure provides a quarter-wave transformer for the harmonic frequency component of the input signal; and
    a plurality of harmonic filtering networks configured in series with one another, each of the harmonic filtering networks comprising:

a respective harmonic impedance transformation network for transforming a respective harmonic impedance transformation network input impedance to a respective harmonic impedance transformation network output impedance, wherein at least one harmonic impedance transformation network is configured to present an optimum impedance for at least one respective harmonic frequency component of the input signal; and a respective tuned impedance element coupled to a respective harmonic impedance transformation network output of the respective harmonic impedance transformation network, the respective tuned impedance element presenting a short circuit impedance at the respective harmonic impedance transformation network output for the at least one respective harmonic frequency component and presenting a higher impedance for the fundamental frequency component, wherein the at least one respective harmonic frequency component is a respective harmonic of the fundamental frequency component.

16. The matching network of claim 15 further comprising:
a fundamental impedance transformation network having a first fundamental impedance transformation network terminal coupled to a final respective harmonic impedance transformation network output and to a load, the fundamental impedance transformation network configured to match a fundamental impedance transformation network input impedance for the fundamental frequency component to a load impedance of the load.

17. The matching network of claim 15 wherein the matching network is disposed within an integrated circuit package of an integrated circuit.

18. A method for matching a source impedance to a load impedance in a matching network comprising:
disposing a bias feed microstrip proximate to and connected with an input terminal of the matching network, the bias feed microstrip coupled to a direct current (DC) voltage source, the bias feed microstrip structure having a bias feed microstrip electrical length less than one fifth of a fundamental wavelength of a fundamental frequency component of an input signal at the input terminal, wherein the bias feed microstrip structure provides a quarter-wave transformer for the harmonic frequency component of the input signal;

transforming a harmonic impedance transformation network input impedance at the input terminal to a harmonic impedance transformation network output impedance, wherein the transforming is configured to present, with respect to the input terminal, an optimum impedance for a harmonic frequency component of the input signal;

filtering a transformed signal using a tuned impedance element to present a short circuit impedance for the harmonic frequency component but not for the fundamental frequency component, wherein the harmonic frequency component is a harmonic of the fundamental frequency component; and transforming the harmonic impedance transformation network output impedance for the fundamental frequency component to match a load impedance of a load.

19. The method of claim 18 wherein the transforming the harmonic impedance transformation network output impedance to match the load impedance of the load comprises:
additionally transforming the harmonic impedance transformation network output impedance to an additional harmonic impedance transformation network output impedance, wherein the additionally transforming presents an additional optimum impedance for an additional harmonic frequency component of the input signal; and additionally filtering an additionally transformed signal using an additional tuned impedance element to present an additional short circuit impedance for the additional harmonic frequency component but not for the fundamental frequency component, wherein the additional harmonic frequency component is an additional harmonic of the fundamental frequency component.

20. The method of claim 18 further comprising:
disposing the matching network within an integrated circuit package of an integrated circuit.

* * * * *